(12) United States Patent
Ginsburg et al.

(10) Patent No.: US 8,942,643 B2
(45) Date of Patent: Jan. 27, 2015

(54) ROUTING FOR A PACKAGE ANTENNA

(75) Inventors: Brian P. Ginsburg, Allen, TX (US); Eunyoung Seok, Plano, TX (US); Vijay B. Rentala, Plano, TX (US); Srinath Ramaswamy, Murphy, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 809 days.

(21) Appl. No.: 13/227,254

(22) Filed: Sep. 7, 2011

(65) Prior Publication Data

US 2013/0059551 A1    Mar. 7, 2013

(51) Int. Cl.
| | |
|---|---|
| *H04B 1/44* | (2006.01) |
| *H01Q 21/00* | (2006.01) |
| *H01Q 21/06* | (2006.01) |
| *H01Q 23/00* | (2006.01) |
| *H01L 23/66* | (2006.01) |
| *H01L 23/00* | (2006.01) |
| *H01L 23/498* | (2006.01) |

(52) U.S. Cl.
CPC ............. *H04B 1/44* (2013.01); *H01Q 21/0006* (2013.01); *H01Q 21/061* (2013.01); *H01Q 23/00* (2013.01); *H01L 23/66* (2013.01); *H01L 2224/16225* (2013.01); *H01L 24/16* (2013.01); *H01L 2924/15321* (2013.01); *H01L 2223/6677* (2013.01); *H01L 2224/32225* (2013.01); *H01L 2224/73204* (2013.01); *H01L 2924/14* (2013.01); *H01L 23/49816* (2013.01)
USPC .............. 455/78; 343/850; 343/860; 343/909

(58) Field of Classification Search
CPC ....................................................... H01Q 23/00
USPC ........................ 455/73, 78; 343/850, 860, 909
See application file for complete search history.

(56) References Cited

U.S. PATENT DOCUMENTS

| | | | |
|---|---|---|---|
| 7,123,209 B1 * | 10/2006 | Desclos et al. ................ | 343/860 |
| 7,277,063 B2 | 10/2007 | Shirosaka et al. | |
| 7,511,680 B2 | 3/2009 | Shtrom et al. | |
| 2003/0052834 A1 * | 3/2003 | Sievenpiper et al. ......... | 343/909 |

* cited by examiner

*Primary Examiner* — Hsin-Chun Liao
(74) *Attorney, Agent, or Firm* — John R. Pessetto; Frederick J. Telecky, Jr.

(57) ABSTRACT

An apparatus is provided. A plurality of transceiver antennas are arranged to form a phased array, where each antenna include a differential transmit antenna and a differential receive antenna arranged in a first pattern. A plurality of transceivers are arranged in a second pattern that is substantially symmetrical, and each transceiver is associated with at least one of the transceiver antennas and includes a feed network. Each feed network has a power amplifier (PA), a first matching network that is coupled between the PA and its associated transmit antenna so as to translate the phase of each differential transmit signal, a low noise amplifier (LNA), and a second matching network that is coupled between the LNA and its associated receive antenna so as to translate the phase of each differential receive signal.

14 Claims, 5 Drawing Sheets

ROUTING FOR A PACKAGE ANTENNA

TECHNICAL FIELD

The invention relates generally to a phased array and, more particularly, to antenna routing for a phased array for use in the terahertz frequency range.

BACKGROUND

Phased array systems have been employed in a variety of applications, but, for high frequency applications (i.e., terahertz radiation), creating a distribution system can be difficult. These difficulties often arise from mismatches between the layout or patterns of the transceiver antennas and the layout of the transceiver. Thus, there is a need for an apparatus that appropriately routes a symmetrically arranged set of transceivers to a phased array. Some examples of conventional systems are: U.S. Pat. No. 7,511,680; and U.S. Pat. No. 7,277,063

SUMMARY

An embodiment of the present invention, accordingly, provides an apparatus. The apparatus comprises a plurality of transceiver antennas that are arranged to form a phased array, wherein each antenna includes a differential transmit antenna and a differential receive antenna arranged in a first pattern; and a plurality of transceivers that are arranged in a second pattern, wherein the second pattern is substantially symmetrical, and wherein each transceiver is associated with at least one of the transceiver antennas, and wherein each transceiver includes a feed network having: a power amplifier (PA); a first matching network that is coupled between the PA and its associated transmit antenna so as to translate the phase of each differential transmit signal; a low noise amplifier (LNA); and a second matching network that is coupled between the LNA and its associated receive antenna so as to translate the phase of each differential receive signal.

In accordance with an embodiment of the present invention, the apparatus further comprises an antenna package that includes the plurality of transceiver antennas, and wherein the apparatus further comprises an integrated circuit (IC) that includes the plurality of transceivers and that is secured to the antenna package.

In accordance with an embodiment of the present invention, the antenna package further comprises a high impedance surface (HIS) that substantially surrounds the phased array.

In accordance with an embodiment of the present invention, each transceiver antenna further comprises: a window region having the differential transmit and receive antennas located therein; and a border region the substantially surrounds the window region.

In accordance with an embodiment of the present invention, the differential transmit and receive antennas further comprise loop antennas.

In accordance with an embodiment of the present invention, the plurality of transceivers further comprises: a first set of transceivers located in a first region, wherein each transceiver from the first set of transceivers has a first layout; a second set of transceivers located in a second region, wherein each transceiver from the second set of transceivers has a second layout that is mirror symmetric with the first layout; a third set of transceivers located in a third region, wherein each transceiver from the third set of transceivers has a third layout that is mirror symmetric with the second layout; and a fourth set of transceivers located in a fourth region, wherein each transceiver from the fourth set of transceivers has a fourth layout that is mirror symmetric with the third and first layouts.

In accordance with an embodiment of the present invention, the first and second matching networks for each transceiver from the second and fourth sets of transceivers further comprises direct links to the respective differential transmit and receive antennas.

In accordance with an embodiment of the present invention, the first and second matching networks for each transceiver from the first and third sets of transceivers further comprises crossover links to the respective differential transmit and receive antennas.

In accordance with an embodiment of the present invention, each the first matching network for each transceiver from the first and third sets of transceivers further comprises a first phase shifter that is coupled to its PA, and wherein each the second matching networks for each transceiver from the first and third sets of transceivers further comprises a second phase shifter that is coupled to its LNA.

In accordance with an embodiment of the present invention, an apparatus is provided. The apparatus comprises a first transceiver antenna having: a first differential transmit antenna; and a first differential receive antenna, wherein the first differential transmit and receive antennas are arranged in a first pattern; a second transceiver antenna having: a second differential transmit antenna; and a second differential receive antenna, wherein the second differential transmit and receive antennas are arranged in a second pattern; a third transceiver antenna having: a third differential transmit antenna; and a third differential receive antenna, wherein the third differential transmit and receive antennas are arranged in a third pattern; a fourth transceiver antenna having: a fourth differential transmit antenna; and a fourth differential receive antenna, wherein the fourth differential transmit and receive antennas are arranged in a fourth pattern, and wherein the first, second, third, and fourth patterns are substantially the same, and wherein the first, second, third, and fourth transceiver antennas are arranged to form a phased array; a first transceiver having: a first PA; a first matching network that is coupled between the first PA and the first transmit antenna so as to perform a first phase translation; a first LNA; and a second matching network that is coupled between the first LNA and the first receive antenna so as to perform the phase translation; a second transceiver having: a second PA; a third matching network that is coupled between the second PA and the second transmit antenna so as to perform a second phase translation; a second LNA; and a fourth matching network that is coupled between the second LNA and the second receive antenna so as to perform the second phase translation; a third transceiver having: a third PA; a fifth matching network that is coupled between the third PA and the third transmit antenna so as to perform the first phase translation; a third LNA; and a sixth matching network that is coupled between the third LNA and the third receive antenna so as to perform the first phase translation; and a fourth transceiver having: a fourth PA; a seventh matching network that is coupled between the fourth PA and the fourth transmit antenna so as to perform the second phase translation; a fourth LNA; and an eighth matching network that is coupled between the fourth LNA and the fourth receive antenna so as to perform the second phase translation.

In accordance with an embodiment of the present invention, the apparatus further comprises an antenna package that includes the first, second, third, and fourth transceiver antennas, and wherein the apparatus further comprises an IC that includes the first, second, third, and fourth transceivers and that is secured to the antenna package.

In accordance with an embodiment of the present invention, each of the first, second, third, and fourth transceiver antennas further comprises: a window region having its associated differential transmit and receive antennas located therein; and a border region the substantially surrounds the window region.

In accordance with an embodiment of the present invention, the first, second, third, and fourth differential transmit and receive antennas further comprise loop antennas.

In accordance with an embodiment of the present invention, the first, second, third, and fourth transceivers have first, second, third, and fourth layouts, respectively, and wherein the third, fourth, seventh, and eighth matching networks further comprise direct links such that the second phase translation is 0°.

In accordance with an embodiment of the present invention, the first, second, fifth, and sixth matching networks further comprise crossover links such that the first phase translation is 180°.

In accordance with an embodiment of the present invention, each of the first and fifth matching networks further comprises a first phase shifter that is coupled to its PA such that the first phase translation is 180°, and wherein each of the second and sixth matching networks further comprises a second phase shifter that is coupled to its LNA.

In accordance with an embodiment of the present invention, an apparatus is provided. The apparatus comprises an antenna package having: a first set of transceiver antennas, wherein each transceiver antenna from the first set of transceiver antennas: a first transmit element; a second transmit element; a first receive element; and a second receive element, wherein the first transmit element, the second transmit element, the first receive element, and the second receive element are arranged in a first pattern; a second set of transceiver antennas, wherein each transceiver antenna from the second set of transceiver antennas: a third transmit element; a fourth transmit element; a third receive element; and a fourth receive element, wherein the third transmit element, the fourth transmit element, the third receive element, and the fourth receive element are arranged in the first pattern; a third set of transceiver antennas, wherein each transceiver antenna from the third set of transceiver antennas: a fifth transmit element; a sixth transmit element; a fifth receive element; and a sixth receive element, wherein the fifth transmit element, the sixth transmit element, the fifth receive element, and the sixth receive element are arranged in the first pattern; a fourth set of transceiver antennas, wherein each transceiver antenna from the fourth set of transceiver antennas: a seventh transmit element; an eighth transmit element; a seventh receive element; and an eighth receive element, wherein the seventh transmit element, the eighth transmit element, the seventh receive element, and the eighth receive element are arranged in the first pattern; an IC that is secured to the antenna package, wherein the IC includes: a first set of transceivers, wherein each transceiver from the first set of transceivers includes: a first PA; a first matching network that is coupled between the first PA and the first and second transmit elements so as to perform a phase translation of 0°; a first LNA; and a second matching network that is coupled between the first LNA and the first and second receive elements so as to perform the phase translation of 0°; a second set of transceivers, wherein each transceiver from the second set of transceivers includes: a second PA; a third matching network that is coupled between the second PA and the third and fourth transmit elements so as to perform a phase translation of 180°; a second LNA; and a fourth matching network that is coupled between the second LNA and the third and fourth receive elements so as to perform the phase translation of 180°; a third set of transceivers, wherein each transceiver from the third set of transceivers includes: a third PA; a fifth matching network that is coupled between the third PA and the fifth and sixth transmit elements so as to perform the phase translation of 0°; a third LNA; and a sixth matching network that is coupled between the third LNA and the fifth and sixth receive elements so as to perform the phase translation 0°; and a fourth set of transceivers, wherein each transceiver from the fourth set of transceivers includes: a fourth PA; a seventh matching network that is coupled between the fourth PA and the seventh and eighth transmit antenna so as to perform the phase translation of 180°; a fourth LNA; and an eighth matching network that is coupled between the fourth LNA and the seventh and eighth receive antenna so as to perform the phase translation of 180°.

In accordance with an embodiment of the present invention, the first, second, third, and fourth sets of transceivers have first, second, third, and fourth layouts, respectively, and wherein the third, fourth, seventh, and eighth matching networks further comprise crossover links.

In accordance with an embodiment of the present invention, the first, second, third, and fourth sets of transceivers have first, second, third, and fourth layouts, respectively, and wherein each of the third and seventh matching networks further comprises a first phase shifter that is coupled to its PA, and wherein each of the fourth and eighth matching networks further comprises a second phase shifter that is coupled to its LNA.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 1:
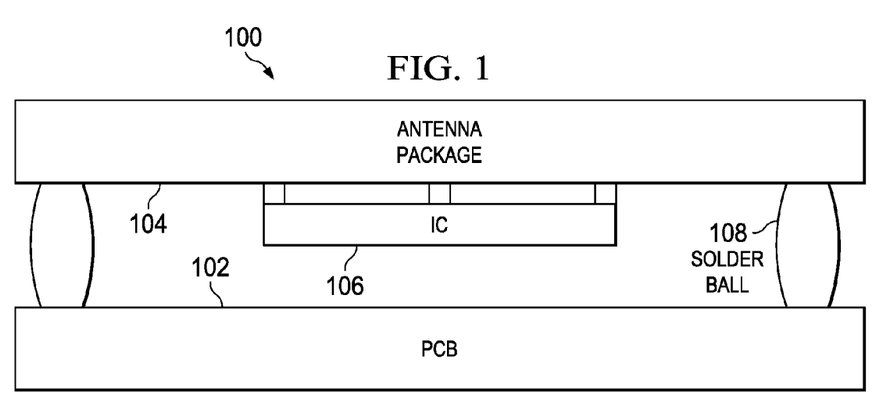
FIG. 1 is a side elevation view of an example of a system in accordance with an embodiment of the present invention.

Turning to FIG. 1, an example of a system 100 in accordance with an embodiment of the present invention can be seen. This system 100 generally comprises a printed circuit board (PCB) 102, an antenna package 104, and an integrated circuit (IC) 106. The IC 106 generally includes radio frequency (RF) circuitry. For example, IC 106 can be a terahertz phased array system that includes multiple transceivers. An example of such an IC can be seen in co-pending U.S. patent application Ser. No. 12/878,484, which is entitled "Terahertz Phased Array System," filed on Sep. 9, 2010, and is hereby incorporated by reference for all purposes. This IC 106 is then secured to the antenna packages 104 to allow each transceiver (for example) to communicate with a transceiver antenna included on the antenna package 104.

Figure 2:
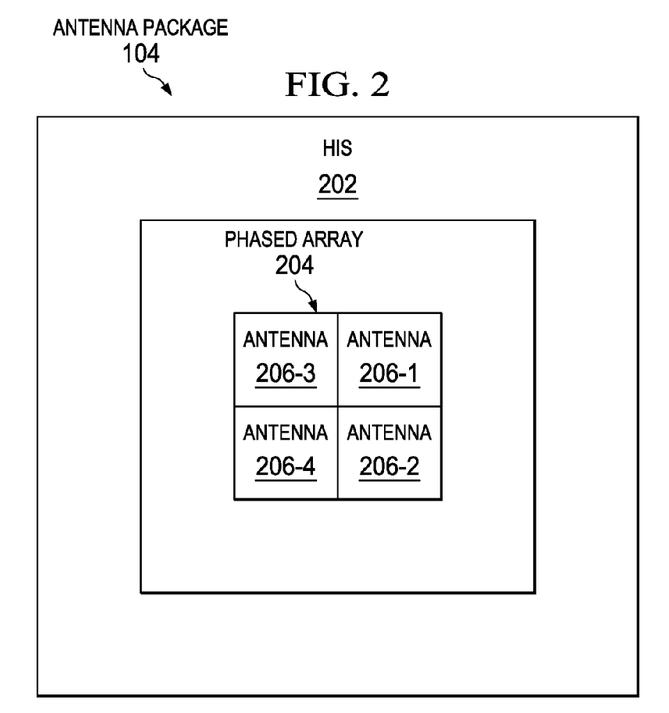
FIG. 2 is a plan view of an example of the antenna package of FIG. 1.

In FIG. 2, an example of the antenna package 104 can be seen in greater detail. As shown, the antenna package 104 includes a phased array 204 that is substantially surrounded by a high impedance surface (HIS). An example of such an HIS can be seen in U.S. patent application Ser. No. 13/116,885, which is entitled "High Impedance Surface," was filed on May 26, 2011, and is hereby incorporated by reference for all purposes. Also, as shown, the phased array 204 includes transceiver antennas 206-1 to 206-4, but any number of antennas is possible that are arranged into the four quadrants or regions. This phased array 204 can then be used to steer the beam of radiation.

Figure 3:
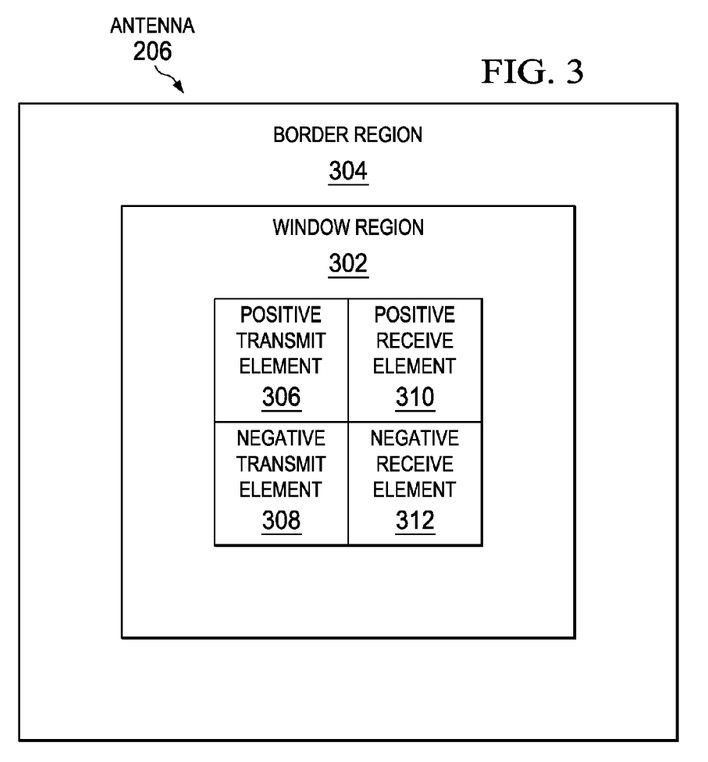
FIG. 3 is plan view of a transceiver antenna of FIG. 2.
Figure 4:
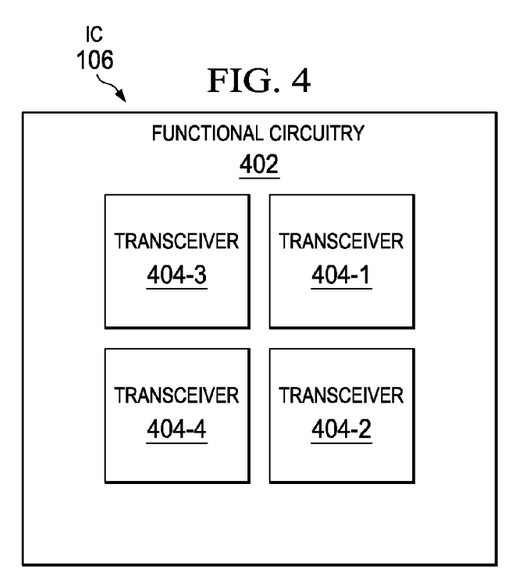
FIG. 4 is a plan view of an example of the IC of FIG. 1.

In FIGS. 3 and 4, an example of the structure of each of the antennas 206-1 to 206-4 (hereinafter labeled 206 for FIG. 3) and IC 106 can be seen. Antenna 206 can be (for example) configured to operate at 160 GHz. For this example operating frequency, the area occupied by the antenna (as shown in FIGS. 3-12) can be 940 μm×940 μm. As shown, antenna 206 generally comprises a border region 304 (which is typically grounded) that substantially surrounds a window region 302. Within window region 302, there is a differential transmit antenna (which typically includes positive transmit element 306 and a negative transmit element 308) and a differential receive antenna (which typically includes positive receive element 310 and negative receive element 312). Example of the differential transmit and receive antennas can be found in: (1) U.S. patent application Ser. No. 13/191,157, which is entitled "Cross-Loop Antenna" and which was filed on Jul. 26, 2011; and (2) U.S. patent application Ser. No. 13/189,193, which is entitled "Loop Antenna" and which was filed on Jul. 22, 2011. Each of these applications is incorporated by reference for all purposes. Additionally, IC 106 (as shown in FIG. 4) includes transceivers 404-1 to 404-4 that are associated with and coupled to antennas 206-1 to 206-4, respectively, and these transceivers 404-1 to 404-2 receive transmit signals from and provide receives signals to functional circuitry 402 (which can include, for example, a local oscillator). Alternatively, each antenna 206-1 to 206-4 (and the corresponding transceivers 404-1 to 404-4) can replaced by a plurality of antennas (and a plurality of corresponding transceivers) arranged in the regions or quadrants shown.

Figure 5:
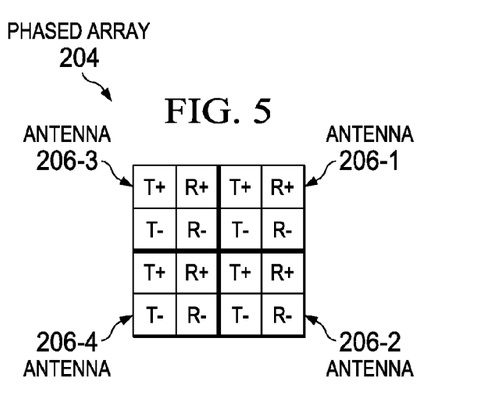
FIG. 5 is a diagram depicting an example of the pattern for the layout of the phased array of FIG. 2.
Figure 6:
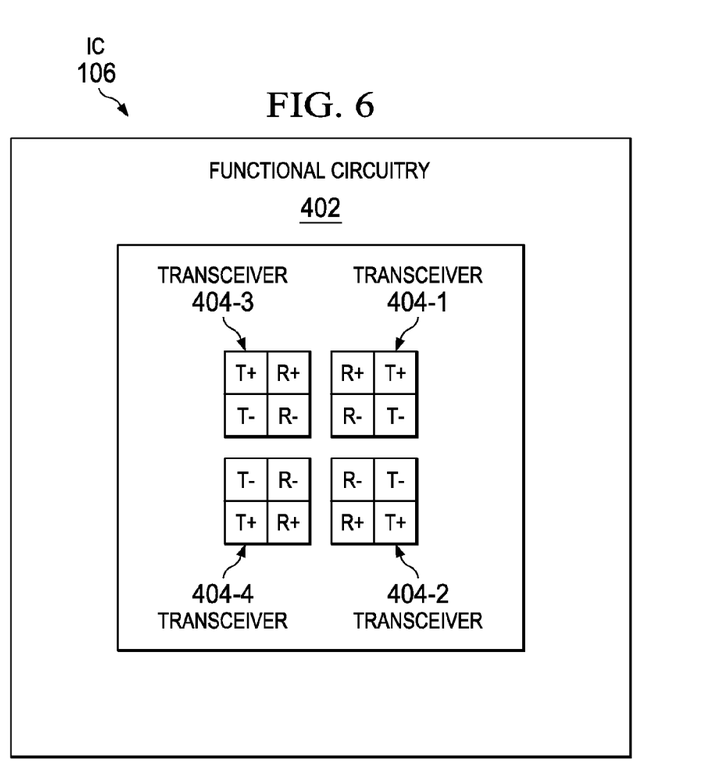
FIG. 6 is a diagram depicting an example of the pattern for the layouts of transceivers on the IC of FIG. 4.
Figure 7:
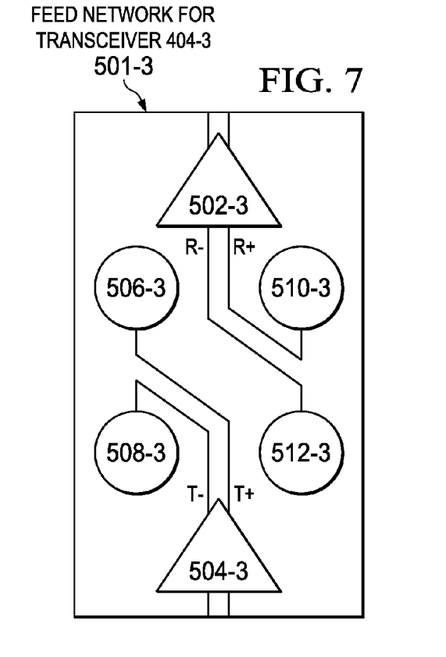
FIGS. 7-12 are diagrams depicting examples of the feed networks for the transceivers of FIG. 4.
Figure 8:
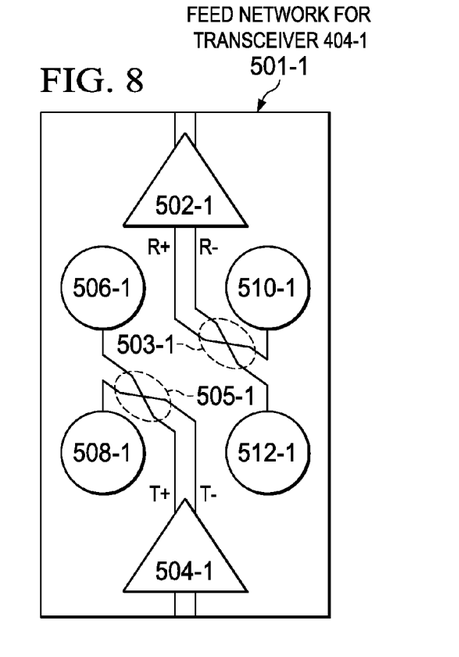
Figure 9:
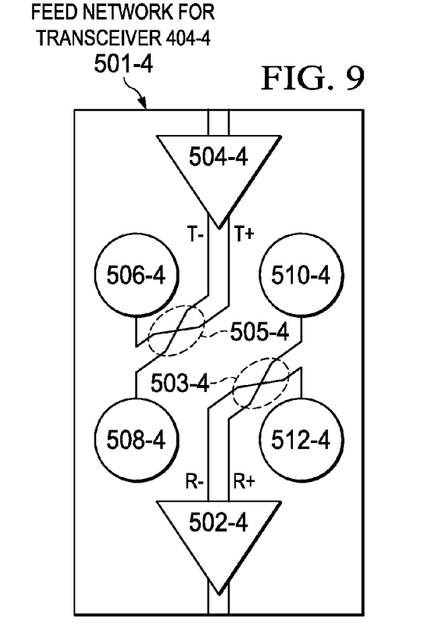
Figure 10:
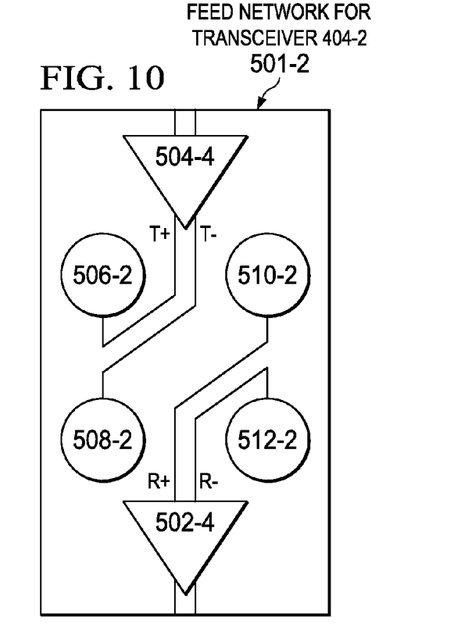

The arrangement for the phased array 204 and transceivers 404-1 to 404-4 generally do not match (as shown in FIGS. 5 and 6). For the phased array 204 to function properly, the pattern for the differential transmit and receive antennas for each transceiver antenna 206-1 to 206-4 should generally match or be substantially the same. As shown in the example of FIG. 5, for each of antennas 206-1 to 206-4, elements 306, 308, 310, and 312 (which correspond to T+, T−, R+, and R−, respectively) are arranged in the upper left, lower left, upper right and lower right corners, respectively. Transceivers 404-1 to 404-4 (as shown in the example of FIG. 6) are arranged in a pattern so that the layouts for transceivers 404-1 to 404-4 are be symmetrical around the center (mirror images of one another) so that (for example) transmit signals can be distributed from the center. These different patterns can lead to mismatches between the IC 106 and antenna package 104. To eliminate these mismatches, one of two approaches can be employed. In the first approach transceivers 404-1 to 404-4 can be rearranged to match antennas 206-1 to 206-4, but this approach can lead to a variety of other problems (including noise and other mismatch errors). In the second approach (which is shown in the examples of FIGS. 7-12), the routing can be adjusted. Thus, transceivers 404-1 to 404-4 can have substantially the same topology and layout, except for routing to the associated antennas.

Figure 11:
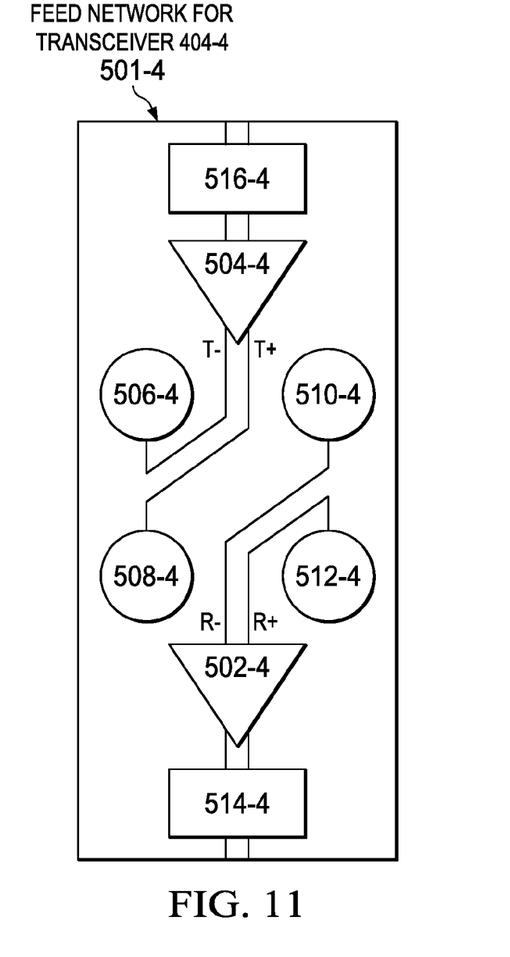
Figure 12:
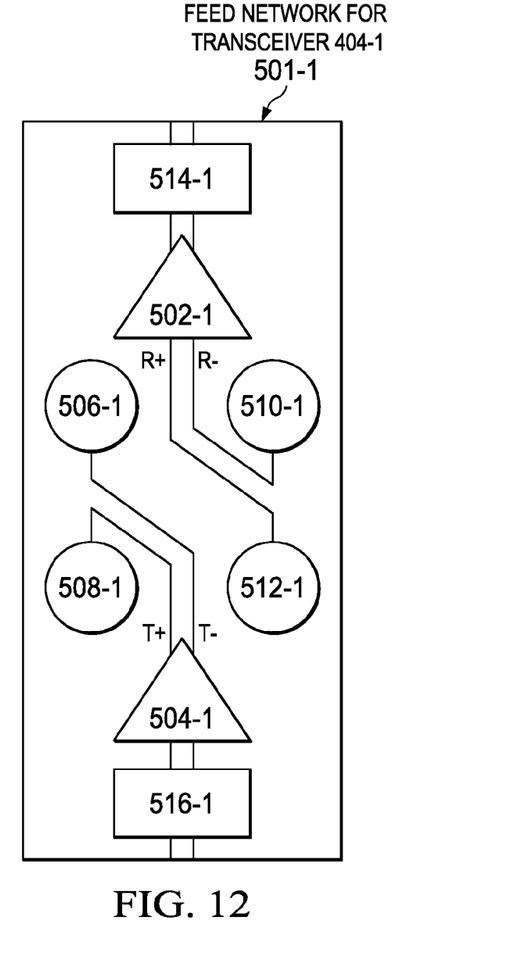

Turning to FIGS. 7-10, phase translations are employed to compensate for mismatches. As shown in this example, the layouts for transmitters 404-1 to 404-4 have positive transmit lines (denoted T+) and positive receive lines (denoted R+) nearest to the center to allow for transmit signals to be routed from the center (among other reasons). As a result, a 0° phase translation or phase shift can be used for feed networks 501-3 and 503-2, so the matching networks form direct links between power amplifiers (PAs) 504-3 and 504-2 and terminals 506-3/508-3 and 506-2/508-2 and form direct links between low noise amplifiers (LNAs) 502-3 and 502-2 and terminals 510-3/512-3 and 510-2/512-2. Because feed networks 501-1 and 501-4 are mirror images of feed networks 501-3 and 501-2, respectively, a 180° phase translation or phase shift should be employed for feed networks 501-1 and 501-4. This is accomplished by the use of crossover links 503-1 (between terminals 510-1/512-1 and LNA 502-1 or at the output of LNA 502-1), 505-1 (between terminals 506-1/508-1 and PA 504-1 or at the input of PA 504-1), 503-4 (between terminals 510-4/512-4 and LNA 502-4 or at the output of LNA 502-4), and 505-4 (between terminals 506-4/508-4 and PA 504-4 or at the input of PA 504-4). Alternatively, (as shown in the examples of FIGS. 11 and 12), phase shifters 514-1, 516-4, 516-1, and 516-4 (which perform a 180° phase shift and which are typically present as part of the topology of transceivers 404-1 to 404-4 so as to perform beam steering) can be used at the inputs or outputs of PAs 502-1 and 502-4 and LNAs 504-1 and 504-4, respectively.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
a plurality of transceiver antennas that are arranged to form a phased array, wherein each antenna includes a differential transmit antenna and a differential receive antenna arranged in a first pattern; and
a plurality of transceivers that are arranged in a second pattern, wherein the second pattern is substantially symmetrical, and wherein each transceiver is associated with at least one of the transceiver antennas, and wherein each transceiver includes a feed network having:
a power amplifier (PA);

a first matching network that is coupled between the PA and its associated transmit antenna so as to translate the phase of each differential transmit signal;
a low noise amplifier (LNA); and
a second matching network that is coupled between the LNA and its associated receive antenna so as to translate the phase of each differential receive signal;
wherein the apparatus further comprises an antenna package that includes the plurality of transceiver antennas, and wherein the apparatus further comprises an integrated circuit (IC) that includes the plurality of transceivers and that is secured to the antenna package;
wherein the antenna package further comprises a high impedance surface (HIS) that substantially surrounds the phased array;
wherein each transceiver antenna further comprises:
a window region having the differential transmit and receive antennas located therein; and
a border region the substantially surrounds the window region.

2. The apparatus of claim 1, wherein the differential transmit and receive antennas further comprise loop antennas.

3. An apparatus comprising:
a plurality of transceiver antennas that are arranged to form a phased array, wherein each antenna includes a differential transmit antenna and a differential receive antenna arranged in a first pattern; and
a plurality of transceivers that are arranged in a second pattern, wherein the second pattern is substantially symmetrical, and wherein each transceiver is associated with at least one of the transceiver antennas, and wherein each transceiver includes a feed network having:
a power amplifier (PA);
a first matching network that is coupled between the PA and its associated transmit antenna so as to translate the phase of each differential transmit signal;
a low noise amplifier (LNA); and
a second matching network that is coupled between the LNA and its associated receive antenna so as to translate the phase of each differential receive signal;
wherein the apparatus further comprises an antenna package that includes the plurality of transceiver antennas, and wherein the apparatus further comprises an integrated circuit (IC) that includes the plurality of transceivers and that is secured to the antenna package;
wherein the antenna package further comprises a high impedance surface (HIS) that substantially surrounds the phased array;
wherein the plurality of transceivers further comprises:
a first set of transceivers located in a first region, wherein each transceiver from the first set of transceivers has a first layout;
a second set of transceivers located in a second region, wherein each transceiver from the second set of transceivers has a second layout that is mirror symmetric with the first layout;
a third set of transceivers located in a third region, wherein each transceiver from the third set of transceivers has a third layout that is mirror symmetric with the second layout; and
a fourth set of transceivers located in a fourth region, wherein each transceiver from the fourth set of transceivers has a fourth layout that is mirror symmetric with the third and first layouts.

4. The apparatus of claim 3, wherein the first and second matching networks for each transceiver from the second and fourth sets of transceivers further comprises direct links to the respective differential transmit and receive antennas.

5. The apparatus of claim 4, wherein the first and second matching networks for each transceiver from the first and third sets of transceivers further comprises crossover links to the respective differential transmit and receive antennas.

6. The apparatus of claim 4, wherein each the first matching network for each transceiver from the first and third sets of transceivers further comprises a first phase shifter that is coupled to its PA, and wherein each the second matching networks for each transceiver from the first and third sets of transceivers further comprises a second phase shifter that is coupled to its LNA.

7. An apparatus comprising:
a first transceiver antenna having:
a first differential transmit antenna; and
a first differential receive antenna, wherein the first differential transmit and receive antennas are arranged in a first pattern;
a second transceiver antenna having:
a second differential transmit antenna; and
a second differential receive antenna, wherein the second differential transmit and receive antennas are arranged in a second pattern;
a third transceiver antenna having:
a third differential transmit antenna; and
a third differential receive antenna, wherein the third differential transmit and receive antennas are arranged in a third pattern;
a fourth transceiver antenna having:
a fourth differential transmit antenna; and
a fourth differential receive antenna, wherein the fourth differential transmit and receive antennas are arranged in a fourth pattern, and wherein the first, second, third, and fourth patterns are substantially the same, and wherein the first, second, third, and fourth transceiver antennas are arranged to form a phased array;
a first transceiver having:
a first PA;
a first matching network that is coupled between the first PA and the first transmit antenna so as to perform a first phase translation;
a first LNA; and
a second matching network that is coupled between the first LNA and the first receive antenna so as to perform the phase translation;
a second transceiver having:
a second PA;
a third matching network that is coupled between the second PA and the second transmit antenna so as to perform a second phase translation;
a second LNA; and
a fourth matching network that is coupled between the second LNA and the second receive antenna so as to perform the second phase translation;
a third transceiver having:
a third PA;
a fifth matching network that is coupled between the third PA and the third transmit antenna so as to perform the first phase translation;
a third LNA; and
a sixth matching network that is coupled between the third LNA and the third receive antenna so as to perform the first phase translation; and
a fourth transceiver having:
a fourth PA;

a seventh matching network that is coupled between the fourth PA and the fourth transmit antenna so as to perform the second phase translation;
a fourth LNA; and
an eighth matching network that is coupled between the fourth LNA and the fourth receive antenna so as to perform the second phase translation;
wherein the apparatus further comprises an antenna package that includes the first, second, third, and fourth transceiver antennas, and wherein the apparatus further comprises an IC that includes the first, second, third, and fourth transceivers and that is secured to the antenna package;
wherein the antenna package further comprises an HIS that substantially surrounds the phased array;
wherein each of the first, second, third, and fourth transceiver antennas further comprises:
a window region having its associated differential transmit and receive antennas located therein; and
a border region the substantially surrounds the window region.

8. The apparatus of claim 7, wherein the first, second, third, and fourth differential transmit and receive antennas further comprise loop antennas.

9. The apparatus of claim 7, wherein the first, second, third, and fourth transceivers have first, second, third, and fourth layouts, respectively, and wherein the third, fourth, seventh, and eighth matching networks further comprise direct links such that the second phase translation is 0°.

10. The apparatus of claim 9, wherein the first, second, fifth, and sixth matching networks further comprise crossover links such that the first phase translation is 180°.

11. The apparatus of claim 9, wherein each of the first and fifth matching networks further comprises a first phase shifter that is coupled to its PA such that the first phase translation is 180°, and wherein each of the second and sixth matching networks further comprises a second phase shifter that is coupled to its LNA.

12. An apparatus comprising:
an antenna package having:
a first set of transceiver antennas, wherein each transceiver antenna from the first set of transceiver antennas:
a first transmit element;
a second transmit element;
a first receive element; and
a second receive element, wherein the first transmit element, the second transmit element, the first receive element, and the second receive element are arranged in a first pattern;
a second set of transceiver antennas, wherein each transceiver antenna from the second set of transceiver antennas:
a third transmit element;
a fourth transmit element;
a third receive element; and
a fourth receive element, wherein the third transmit element, the fourth transmit element, the third receive element, and the fourth receive element are arranged in the first pattern;
a third set of transceiver antennas, wherein each transceiver antenna from the third set of transceiver antennas:
a fifth transmit element;
a sixth transmit element;
a fifth receive element; and
a sixth receive element, wherein the fifth transmit element, the sixth transmit element, the fifth receive element, and the sixth receive element are arranged in the first pattern;
a fourth set of transceiver antennas, wherein each transceiver antenna from the fourth set of transceiver antennas:
a seventh transmit element;
an eighth transmit element;
a seventh receive element; and
an eighth receive element, wherein the seventh transmit element, the eighth transmit element, the seventh receive element, and the eighth receive element are arranged in the first pattern;
an IC that is secured to the antenna package, wherein the IC includes:
a first set of transceivers, wherein each transceiver from the first set of transceivers includes:
a first PA;
a first matching network that is coupled between the first PA and the first and second transmit elements so as to perform a phase translation of 0°;
a first LNA; and
a second matching network that is coupled between the first LNA and the first and second receive elements so as to perform the phase translation of 0°;
a second set of transceivers, wherein each transceiver from the second set of transceivers includes:
a second PA;
a third matching network that is coupled between the second PA and the third and fourth transmit elements so as to perform a phase translation of 180°;
a second LNA; and
a fourth matching network that is coupled between the second LNA and the third and fourth receive elements so as to perform the phase translation of 180°;
a third set of transceivers, wherein each transceiver from the third set of transceivers includes:
a third PA;
a fifth matching network that is coupled between the third PA and the fifth and sixth transmit elements so as to perform the phase translation of 0°;
a third LNA; and
a sixth matching network that is coupled between the third LNA and the fifth and sixth receive elements so as to perform the phase translation 0°; and
a fourth set of transceivers, wherein each transceiver from the fourth set of transceivers includes:
a fourth PA;
a seventh matching network that is coupled between the fourth PA and the seventh and eighth transmit antenna so as to perform the phase translation of 180';
a fourth LNA; and
an eighth matching network that is coupled between the fourth LNA and the seventh and eighth receive antenna so as to perform the phase translation of 180°.

13. The apparatus of claim 12, wherein the first, second, third, and fourth sets of transceivers have first, second, third, and fourth layouts, respectively, and wherein the third, fourth, seventh, and eighth matching networks further comprise crossover links.

14. The apparatus of claim 12, wherein the first, second, third, and fourth sets of transceivers have first, second, third, and fourth layouts, respectively, and wherein each of the third and seventh matching networks further comprises a first phase shifter that is coupled to its PA, and wherein each of the fourth and eighth matching networks further comprises a second phase shifter that is coupled to its LNA.

* * * * *